United States Patent [19]

Schulz

[11] Patent Number: 4,603,294

[45] Date of Patent: Jul. 29, 1986

[54] MEASURING DEVICE FOR THE ACCURATE ADJUSTMENT OF THE START-OF-MEASUREMENT OF A MEASURING TRANSDUCER

[75] Inventor: Winfried Schulz, Berlin, Fed. Rep. of Germany

[73] Assignee: Siemens Aktiengesellschaft, Munich, Fed. Rep. of Germany

[21] Appl. No.: 479,500

[22] Filed: Mar. 28, 1983

[30] Foreign Application Priority Data

Apr. 6, 1982 [DE] Fed. Rep. of Germany ....... 3213329

[51] Int. Cl.[4] .................. G01R 31/00; G01R 19/00
[52] U.S. Cl. ....................................... 324/96; 324/133
[58] Field of Search ................ 324/96, 133, 102, 122, 324/76, 120; 340/83, 660, 661, 642; 328/206, 112; 307/362, 289, 291

[56] References Cited

U.S. PATENT DOCUMENTS

| | | | |
|---|---|---|---|
| 2,916,670 | 12/1959 | Pederson | 340/83 |
| 3,076,901 | 2/1963 | Rubin et al. | 324/133 |
| 3,576,523 | 4/1971 | Lerbakken | 340/83 |
| 3,626,289 | 12/1971 | Vinson et al. | 324/133 |

Primary Examiner—Ernest F. Karlsen
Attorney, Agent, or Firm—Kenyon & Kenyon

[57] ABSTRACT

A measuring device for the accurate adjustment of the start-of-measurement of a measuring transducer of two-conductor design is disclosed. The measuring device disclosed is of simple design, can be produced inexpensively and is highly accurate. In one embodiment of the measuring device, a pickup resistor is arranged in series with the measuring transducer. The input of a multivibrator is coupled to the pickup resistor. The duty cycle of the multivibrator changes as a function of the voltage at its input. The duty cycle is 1:1 for a current through the pickup resistor corresponding to the start-of-measurement. The multivibrator is coupled to a circuit having two light-emitting diodes which can be fed from the current flowing through the measuring transducer and which light up with equal brightness when the duty cycle is 1:1. The measuring device can be used with all measuring transducers of two-conductor design. In a further embodiment, the measuring device includes a differential amplifier arrangement having outputs coupled to a circuit having two light emitting diodes which light up with equal brightness when the start of measurement is attained.

6 Claims, 2 Drawing Figures

MEASURING DEVICE FOR THE ACCURATE ADJUSTMENT OF THE START-OF-MEASUREMENT OF A MEASURING TRANSDUCER

BACKGROUND OF THE INVENTION

The present invention relates to a measuring device for accurately adjusting the start-of-measurement of a measuring transducer of two-conductor design. As is well known, it is specified for such measuring transducers that their start-of-measurement be at a current of 4 mA. In view of the desired accuracy, this start-of-measurement must be adjusted very accurately, to ±1%. Because of the required high accuracy, this can be accomplished with a digital multimeter; moving-coil indicating instruments are not usable. For adjusting the start-of-measurement of a measuring transducer of two-conductor design, a digital multimeter has therefore always been required to date, which must also be available for checking the start of measurement. Since such measuring devices are relatively expensive, it is not desirable to assign one permanently to a measuring transducer of two-conductor design.

It is therefore an object of the present invention to develop a measuring device for the accurate adjustment of the start-of-measurement of a measuring transducer of two-conductor design which is of simple construction, yet which maintains the required accuracy.

It is a further object to develop such a measuring device which can be produced cost-effectively, so that it can be a fixed part of every measuring transducer of two-conductor design.

SUMMARY OF THE INVENTION

These and other objects of the present invention are achieved in a measuring device of the type described above in which the input of a multivibrator is coupled to pickup means, such as a pickup resistor, arranged in series with the measuring transducer, wherein the duty cycle of the multivibrator, which changes as a function of the voltage at its input, is 1:1 for a current through the pickup resistor which corresponds to the start-of-measurement. The multivibrator is followed by an arrangement having two light-emitting diodes which preferably is supplied by the current flowing through the measuring transducer and which light up with equal brightness for a duty cycle of 1:1.

An advantage of the measuring device of the present invention is that it is of relatively simple design, since it comprises only a multivibrator and a circuit arrangement including two light-emitting diodes. The measuring device according to the invention can therefore be assigned at justifiable cost to every measuring transducer of two-conductor design. The simple design of the measuring device does not affect its measuring accuracy adversely because an adjustment with an accuracy of ≦1% is attainable without difficulty. This is due to the fact that the accurate adjustment of the start-of-measurement is accomplished when both light-emitting diodes light up with equal brightness. When adjusting the start-of-measurement, this can be accomplished by a simple pulse width control of the multivibrator.

A further advantage of the present measuring device is that the voltage drop across the device required at 4 mA can be maintained at less than 3 V and at 20 mA the voltage drop is only insignificantly above 3 V. Should this voltage drop be considered objectionable in the operation of the measuring transducer, the entire measuring device can be shunted by a switch contact after the start of measurement has been adjusted.

In a preferred embodiment of the invention, an electronic switch is connected in series with each of the light-emitting diodes. One of these switches is connected with its control input to the output of the multivibrator. The control input of the other electronic switch is connected to the junction point of the first switch and the light-emitting diode connected in series therewith. The series circuits of the light-emitting diodes and the electronic switches are connected to the output of a voltage stabilizing circuit. It is thus achieved that the operation of the measuring device is independent of whether it is fed with an impressed current or via a variable resistor.

In this embodiment, it is advantageous if a shorting resistor is shunted across the light-emitting diode which is arranged in series with the first electronic switch. It is thereby ensured by this shorting resistor that in the event of a failure of the one light-emitting diode, the other light-emitting diode can still operate. In spite of the failure of one light-emitting diode, a relatively accurate adjustment of the start-of-measurement is still possible when the adjustment is made so that the remaining operational light-emitting diode is at half brightness.

In the measuring device according to the invention, a Zener diode of the voltage stabilizing circuit is preferably connected in series with the pickup resistor, and the terminal of the Zener diode facing away from the pickup resistor is connected by way of a variable resistor to an input terminal of the multivibrator, which input terminal is coupled to the terminal of the pickup resistor facing away from the Zener diode. With this variable resistor, the duty cycle of the multivibrator can be adjusted very accurately to 1:1 at 4 mA.

In a further embodiment, the inputs of a differential amplifier arrangement having two differential amplifiers in which the two differential amplifiers operate in push-pull are coupled to a pickup resistor arranged in series with the measuring transducer. The differential amplifier arrangement is followed by a circuit arrangement having two light-emitting diodes which are controlled by the two differential amplifiers in such a manner that they light up with equal brightness when the start-of-measurement is adjusted accurately. The multivibrator of the previously discussed embodiment is, so to speak, replaced by the two differential amplifiers and the pulsing electronic switches in series with the light-emitting diodes, are replaced by continuously operating electronic control devices. The design of this measuring device is also simple as compared to a digital multimeter. The measuring accuracy is also high, but attention must be given to the temperature stability of the differential amplifiers.

In this further embodiment of the measuring device, electronic control devices, the control inputs of which are connected to the outputs of the differential amplifiers, are preferably connected in series with each of the light-emitting diodes. The series circuits comprising the respective light-emitting diode and the respective electronic control device are connected to a voltage stabilizing circuit.

BRIEF DESCRIPTION OF THE DRAWINGS

The measuring device according to the invention will be described in greater detail in the following detailed description with reference to the drawings in which.

DETAILED DESCRIPTION

Figure 1:
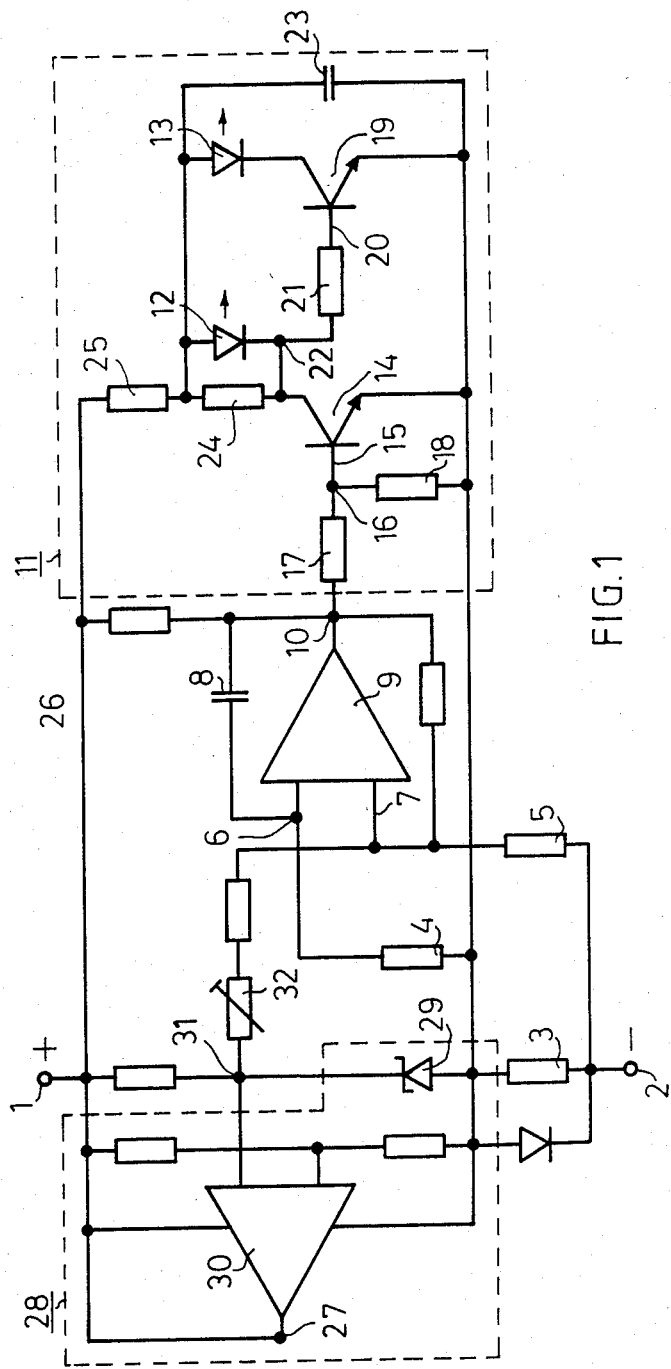
FIG. 1 shows one embodiment of the circuit diagram for the measuring device.

With reference now to the drawings and particularly FIG. 1, the measuring device shown has a terminal 1 and a further terminal 2 which are coupled in series into the circuit of a measuring transducer, not shown in the figure. Between the two terminals 1 and 2 a pickup resistor 3 is disposed which is coupled via resistors 4 and 5 to inputs 6 and 7 of an amplifier 9 which has capacitive feedback due to capacitor 8. The amplifier 9 may be an operational amplifier and functions as a multivibrator.

The output 10 of the multivibrator 9 is coupled to a circuit arrangement 11 having two light-emitting diodes 12 and 13, which are preferably luminescent diodes.

Connected in series with the first light-emitting diode 12 is an electronic switch 14, which, in the embodiment shown, is a transistor. The control input 15 of the electronic switch 14, or the base of the transistor, is connected to a tap 16 of a voltage divider formed by resistors 17 and 18. Arranged in series with the second light-emitting diode 13 is a second electronic switch 19 which may also be a transistor. Its control input 20 or base is connected via a resistor 21 to a common junction point 22 of the first light-emitting diode 12 and the first electronic switch 14. A capacitor 23 is shunted across the series circuit of the second light-emitting diode 13 and the second electronic switch 19. A shunt resistor 24 is arranged in parallel with the first light-emitting diode 12.

The light-emitting diodes 12 and 13 are connected via a resistor 25 to a line 26 which leads to the output 27 of a voltage stabilizing circuit 28. This voltage stabilizing circuit 28 has on the input side a Zener diode 29 which is coupled in series with the pickup resistor 3 between the terminals 1 and 2 of the measuring device. By means of this Zener diode 29, a constant voltage is obtained and amplified in operational amplifier 30 to a value which is required for the operation of the multivibrator 9 and the circuit arrangement 11.

In order to accurately adjust the duty cycle to the value 1:1 at the start-of-measurement and therefore, to a current of 4 mA, a variable resistor 32 is arranged between the terminal 31 of the Zener diode 29 facing away from the pickup resistor 3 and the input 7 of the multivibrator 9. By means of this resistor, the measuring device according to the invention is adjusted once so that for a current of 4 mA, the duty cycle of the multivibrator 9 is 1:1 and both light-emitting diodes 12 and 13 are driven to the same brightness.

The described measuring device operates as follows:

If, upon checking the adjustment of the start-of-measurement, the current through the measuring transducer does not have the value 4 mA, then a corresponding voltage drop at the pickup resistor 3 causes the multivibrator 9 to be controlled so that its duty cycle deviates from the value 1:1. Consequently, light-emitting diode 12, for instance, will light up for a relatively long time because of the relatively long turn-on time of the electronic switch 14 in one cycle, while the other light-emitting diode 13 lights up comparatively briefly. This difference between the duration of the pulsed illumination of the two light-emitting diodes 12 and 13 is perceived by the eye of the operator as a difference in the brightness of the two light-emitting diodes. The fact that the light-emitting diodes 12 and 13 are pulsing is not noticed by the eye if the frequency of the multivibrator is several kHz, as is provided by the circuit. By varying the current via the input terminals 1 and 2 of the measuring device, a voltage drop can be adjusted at the pickup resistor 3 such that the multivibrator 9 has a duty cycle of 1:1. The two electronic switches 14 and 19 are then open in a cycle for the same length of time, and the light-emitting diodes 12 and 13 connected in series therewith each light up for the same length of time. The eye perceives the same brightness in both light-emitting diodes 12 and 13, and the start-of-measurement is thereby adjusted with an accuracy of 1%.

Figure 2:
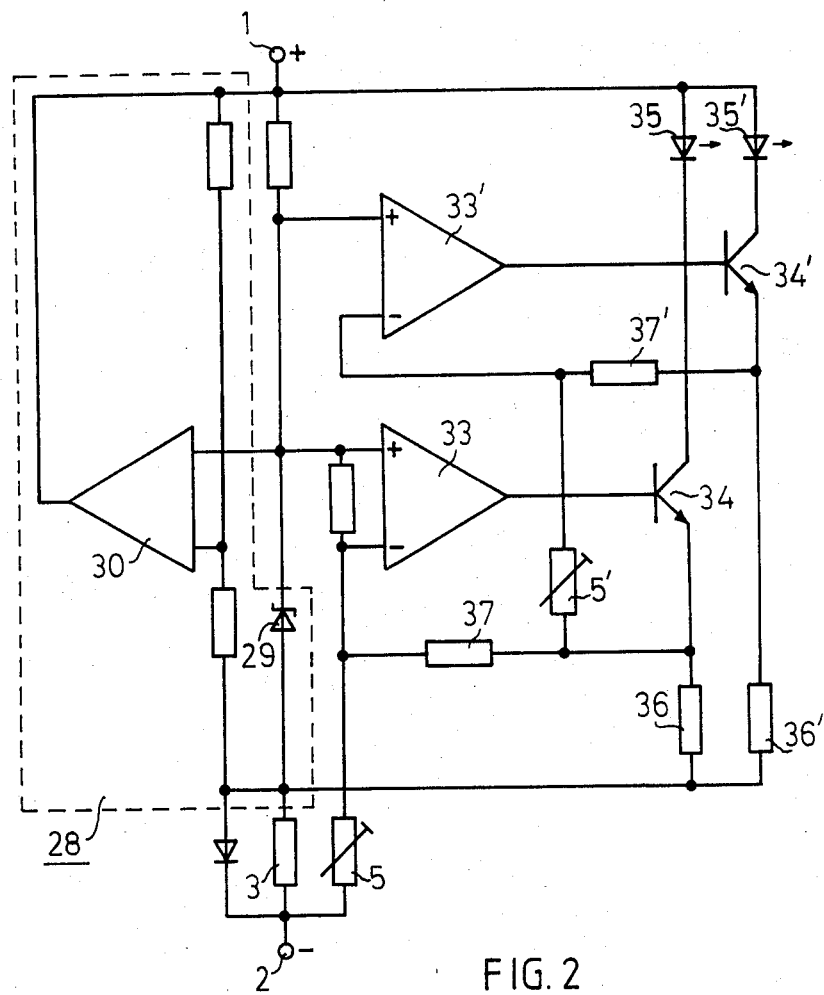
FIG. 2 shows a further embodiment of the measuring device.

FIG. 2 shows a further embodiment of the inventive measuring device. As in the measuring device shown in FIG. 1, the pickup resistor 3 is disposed between the terminals 1 and 2 and in series with the Zener diode 29 of the voltage stabilizing circuit 28. A countercoupled differential amplifier 33 of a differential amplifier arrangement is connected by its non-inverting input via the Zener diode 29 and by its inverting input via the variable resistor 5 to the pickup resistor 3. The output of the differential amplifier 33, which is preferably an operational amplifier, controls the base of a transistor 34, which is switched in the emitter-collector circuit. The collector of the transistor 34 is connected via a light-emitting diode 35 and the emitter via a resistor 36 to the voltage stabilizing circuit 28. Disposed between the emitter of the transistor 34 and the inverting input of the operational amplifier 33 is a countercoupling resistor 37. A further differential amplifier 33' of the differential amplifier arrangement has its inverting input coupled to a further variable resistor 5' and a further countercoupling resistor 37'. The output of differential amplifier 33' is coupled to the base of transistor 34', which is coupled in series with a light-emitting diode 35' and a resistor 36' in the emitter-collector circuit. The non-inverting input of differential amplifier 33' is connected to the non-inverting input of the differential amplifier 33. The inverting input is thus connected via the resistor 5' to the emitter of the transistor 34 and via resistor 37' to the emitter of transistor 34'. The amplifying factor of the differential amplifiers 33 and 33' connected as described and shown in FIG. 2 is adjustable by changing the ratios of the resistors 37 and 5, or 37' and 5'. In the measuring device shown in FIG. 2, the light-emitting diode 35 is controlled in dependence on the sum of the voltage drops across the measuring resistor 3 and across the Zener diode 29, while the light-emitting diode 35' is controlled in dependence on the difference of the voltage drop across the Zener diode 29 and the voltage drop across the resistor 36. Since this latter voltage drop is proportional to the current through light-emitting diode 35, a change in brightness of the other diode takes place in the respectively opposite sense. While the light-emitting diode 35 becomes increasingly brighter with increasing measuring current through the measuring transducer or through the circuit between terminals 1 and 2, the brightness of the light-emitting diode 35' decreases correspondingly. Through the variable resistors 5 and 5', the range of the measuring in which the corresponding light-emitting diode changes its brightness in dependence of the measuring current can be adjusted. The smaller this range is chosen, in which the respective light-emitting diode responds to the measuring current, the more sensitive is the brightness indication. The measuring device may be balanced by resistors 5 and 5' in such manner, that with a measuring current of 4 mA, both light-emitting diodes 35 and 35' are equally bright.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. A measuring device for accurately adjusting the start-of-measurement of a measuring transducer of two-conductor design comprising:
   pickup means arranged in series with the measuring transducer;
   multivibrator means having input terminals coupled across said pickup means and an output, said multivibrator means generating a signal having a duty cycle at said output which changes as a function of the voltage across said input terminals, said duty cycle being 1:1 when the current through said pickup means corresponds to the start-of-measurement; and
   circuit means coupled to the output of said multivibrator means having two light-emitting means, said light emitting means emitting light with equal brightness when said duty cycle is 1:1.

2. The measuring device recited in claim 1 wherein said light emitting means are fed by the current flowing through the measuring transducer and said pickup means comprises a resistor.

3. The measuring device recited in claim 2, further comprising:
   first and second electronic switch means, each coupled in series with respective ones of said light-emitting means, said first switch means having a control input coupled to the output of said multivibrator means, the control input of said second electronic switch means coupled to the junction point of said first switch means and said light-emitting means coupled in series therewith; and
   voltage stabilizing circuit means having an output coupled to the series circuits comprising the respective light-emitting means and the respective electronic switch means.

4. The measuring device recited in claim 3, further comprising a shorting resistor shunted across one of said light-emitting means.

5. The measuring device recited in claim 3, wherein said stabilizing circuit means includes:
   a Zener diode connected in series with said pickup resistor; and
   variable resistor means having one terminal coupled to the side of said Zener diode facing away from the pickup resistor and having a second terminal coupled to one input terminal of said multivibrator means, said input terminal of said multivibrator means further coupled to the side of said pickup resistor facing away from said Zener diode.

6. The measuring device recited in claim 3 wherein said light emitting means comprise light emitting diodes.

* * * * *